United States Patent
Liu et al.

(10) Patent No.: US 11,716,091 B2
(45) Date of Patent: Aug. 1, 2023

(54) MULTI-BIT RESOLUTION SUB-PIPELINE STRUCTURE FOR MEASURING JUMP MAGNITUDE OF TRANSMISSION CURVE

(71) Applicants: NO.24 RESEARCH INSTITUTE OF CHINA ELECTRONICS TECHNOLOGY GROUP CORPORATION, Chongqing (CN); Chongqing GigaChip Technology Co., Ltd., Chongqing (CN)

(72) Inventors: Tao Liu, Chongqing (CN); Jian'an Wang, Chongqing (CN); Yuxin Wang, Chongqing (CN); Shengdong Hu, Chongqing (CN); Zhou Yu, Chongqing (CN); Minming Deng, Chongqing (CN); Daiguo Xu, Chongqing (CN); Lu Liu, Chongqing (CN); Dongbing Fu, Chongqing (CN); Jun Luo, Chongqing (CN); Xu Wang, Chongqing (CN); Yan Wang, Chongqing (CN); Zicheng Xu, Chongqing (CN)

(73) Assignees: No. 24 Research Institute Of China Electronics Technology Group Corporation, Chongqing (CN); Chongqing GigaChip Technology Co., Ltd., Chongqing (CN)

( * ) Notice: Subject to any disclaimer, the term of this patent is extended or adjusted under 35 U.S.C. 154(b) by 67 days.

(21) Appl. No.: 17/614,336

(22) PCT Filed: Jan. 7, 2020

(86) PCT No.: PCT/CN2020/070596
§ 371 (c)(1),
(2) Date: Nov. 25, 2021

(87) PCT Pub. No.: WO2020/238227
PCT Pub. Date: Dec. 3, 2020

(65) Prior Publication Data
US 2022/0224350 A1    Jul. 14, 2022

(30) Foreign Application Priority Data
May 29, 2019    (CN) .......................... 201910454948.7

(51) Int. Cl.
*H03M 1/20*    (2006.01)
*H03M 1/38*    (2006.01)

(52) U.S. Cl.
CPC ............... *H03M 1/20* (2013.01); *H03M 1/38* (2013.01)

(58) Field of Classification Search
CPC ............. H03M 1/20; H03M 1/38; H03M 1/43
(Continued)

(56) References Cited

U.S. PATENT DOCUMENTS

| | | | |
|---|---|---|---|
| 5,638,072 A | 6/1997 | Van Auken et al. | |
| 10,547,319 B2* | 1/2020 | Ali | H03M 1/0687 |
| 2013/0335245 A1* | 12/2013 | Lee | H03M 1/001 |
| | | | 341/110 |

FOREIGN PATENT DOCUMENTS

| CN | 102075189 Y | 5/2011 |
|---|---|---|
| CN | 102751990 A | 10/2012 |

(Continued)

*Primary Examiner* — Peguy Jean Pierre

(57) ABSTRACT

A multi-bit resolution sub-pipeline structure for measuring a jump magnitude of a transmission curve, comprising: a sub-analog-to-digital converter having n-bit resolution configured to quantize input analog voltage signals and output digital voltage signals; a sub-digital-to-analog converter having n-bit resolution configured to convert the digital voltage signals output by the sub-analog-to-digital converter into corresponding analog voltage signals; a decoder having n-bit resolution configured to decode an n-bit binary input signal; and a switched-capacitor amplification unit config- (Continued)

(a)

(b)

ured to, when in a normal mode, perform sampling and residue amplification on the input analog voltage signals; and when in a test mode, measure the jump magnitude of the transmission curve corresponding to each decision level. Magnitude measurement of a transmission curve is performed within $2^n$ clock periods, th and a measurement result is sent to a back-end digital domain of the A/D converter for correction.

10 Claims, 6 Drawing Sheets

(58) Field of Classification Search
USPC .................................. 341/144, 155, 161, 172
See application file for complete search history.

(56) References Cited

FOREIGN PATENT DOCUMENTS

| CN | 106027051 A | 10/2016 |
|----|-------------|---------|
| CN | 106209099 Y | 12/2016 |
| CN | 110176930   | 8/2019  |

* cited by examiner

MULTI-BIT RESOLUTION SUB-PIPELINE STRUCTURE FOR MEASURING JUMP MAGNITUDE OF TRANSMISSION CURVE

CROSS REFERENCE TO RELATED APPLICATION

This is a Sect. 371 National Stage of PCT International Application No. PCT/CN2020/070596, filed on Jan. 7, 2020, which claims the benefit of priority to Chinese Patent Application No. CN 2019104549487, entitled "MULTI-BIT RESOLUTION SUB-PIPELINE STRUCTURE FOR MEASURING JUMP MAGNITUDE OF TRANSMISSION CURVE", filed with CNIPA on May 29, 2019, the disclosure of which is incorporated herein by reference in its entirety.

FIELD OF TECHNOLOGY

The present invention relates to the technical field of integrated circuits, and in particular to a multi-bit resolution sub-pipeline structure for measuring a jump magnitude of a transmission curve, relating to a switched-capacitor based sub-pipeline structure that can be directly applied to a pipelined analog-to-digital converter (A/D converter).

BACKGROUND

In recent years, pipelined A/D converters have become popular in the fields such as high-performance video, medical imaging, and wireless or wired communications, because pipeline A/D converters can achieve a high sampling rate while achieving high precision, both of which benefit from pipeline technology adopted in the pipeline A/D converters. A basic feature of the pipeline technology is cascading multiple stages of low-precision high-sampling-rate A/D converters and processing digital outputs of each stage of sub-pipeline according to a certain algorithm to obtain a final coded output. Functional units of each stage of a pipelined A/D converter are shown in FIG. 1(a), mainly consisting of a sub-A/D converter (SubADC), a sub-D/A converter (SubDAC), a subtraction unit, and a multiplication unit. The sub-A/D converter quantizes and encodes an input analog voltage signal $V_{in}$ to obtain a digital output $D_o$; the sub-D/A converter performs digital-to-analog conversion on the output $D_o$ of the sub-A/D converter to obtain an analog output voltage $D(V_{in})$; and the output $D(V_{in})$ of the sub-D/A converter is subtracted from the input voltage $V_{in}$ and the result is amplified G times to obtain a residual output voltage signal $V_{res}$. In contemporary mixed-signal integrated circuit designs, the sub-D/A converter, the subtraction unit, and the multiplication unit are all implemented with switched capacitors, and such a switched-capacitor circuit is called a multiplying D/A converter (MDAC). A typical transmission function curve of a sub-A/D converter when a quantization precision of the sub-A/D converter is 1 bit is shown in FIG. 1(b), in which a decision level of the sub-A/D converter is 0V; when the input voltage signal $V_{in}$ is less than 0V, the output $D_o$ of the sub-A/D converter is at a logic zero level ($D_o=0$), and in this case the highest point of the residual output voltage signal $V_{res}$ is a voltage signal $V_a$ corresponding to the point A; when the input voltage $V_{in}$ is greater than 0V, the output $D_o$ of the sub-A/D converter is at a logic high level ($D_o=1$), and in this case the lowest point of the residual output voltage signal $V_{res}$ is a voltage signal $V_b$ corresponding to the point B; and a jump magnitude of the transmission curve at the decision level is $V_a$-$V_b$ and the jump magnitude is related to a ratio between capacitors in the MDAC. Due to the influence of manufacturing process deviations, the capacitance values of the capacitors in the MDAC deviate from ideal values, which leads to a deviation of the difference of $V_a$-$V_b$ from its ideal value. This error affects the linearity and other performance indicators of the A/D converter. To deal with the influence of the errors on the performance of the A/D converter, it is necessary to measure an actual magnitude of the transmission curve at the decision level and compensate for the errors.

However, the traditional measurement method (see IEEE Journal of Solid-State Circuits, vol. 28, pp. 1207-1215, December 1993) is: first, fixing the analog input voltage signal $V_{in}$ at zero volt and maintain the input to the sub-D/A converter SubDAC at a logic zero level to obtain a corresponding voltage signal $V_a$ of the residual output curve at the point A, and second, fixing the analog input voltage signal $V_{in}$ at zero volt and maintain the input to the sub-D/A converter SubDAC at a logic high level to obtain a corresponding voltage signal $V_b$ of the residual output curve at the point B, and the difference of $V_a$-$V_b$ is an actual magnitude of the transmission curve. In contemporary high-speed high-precision pipeline A/D converter product design, the first-stage sub-pipeline adopts a multi-bit resolution structure to enable the A/D converter to have optimal characteristics such as lower power consumption and higher precision. Therefore, there is an urgent need for a multi-bit resolution sub-pipeline structure for measuring a jump magnitude of a transmission curve.

SUMMARY

The present invention provides a multi-bit resolution sub-pipeline structure for measuring a jump magnitude of a transmission curve, including:

a sub-analog-to-digital converter having n-bit resolution (i.e., an n-bit sub-ADC) configured to quantize input analog voltage signals under a clock signal and a digital control signal and output digital voltage signals, respectively, wherein the analog voltage signals include an in-phase analog voltage signal $V_{inp}$ and an inverted analog voltage signal $V_{inn}$; a positive reference voltage $V_{REFP}$, and a negative reference voltage $V_{REFN}$;

a first sub-digital-to-analog converter and a second sub-digital-to-analog converter having n-bit resolution (i.e., an n-bit first sub-DAC, and an n-bit second sub-DAC), each configured to correspondingly convert the digital voltage signals output by the sub-analog-to-digital converter into analog voltage signals, respectively;

a decoder having n-bit resolution (i.e., an n-bit decoder) configured to decode an n-bit binary input signal and output a digital control signal; and a switched-capacitor amplification unit configured to, when in a normal mode, perform sampling and residue amplification on the input analog voltage signal; and when in a test mode, measure the jump magnitude of the transmission curve corresponding to each decision level.

As described above, the multi-bit resolution sub-pipeline structure for measuring a jump magnitude of a transmission curve of the present invention has the following beneficial effects:

The present invention can achieve magnitude measurement of the transmission curve within $2^n$ (n is the resolution of the sub-pipeline, and n≤4 for the sub-A/D converters of different stages of a current pipeline A/D converter) clock periods (Ts=1/fs, where fs is a working clock frequency of the pipeline), thereby providing a fast measurement speed; and a measurement result is sent to a back-end digital domain of the A/D converter for correction, thereby improving the linearity of the A/D converter by 10-15 dB after the correction.

BRIEF DESCRIPTION OF THE DRAWINGS

FIG. 1-(b) is a schematic diagram of a transmission curve of a sub-pipeline having 1-bit resolution provided in the present invention;

DETAILED DESCRIPTION

Embodiments of the present invention will be described below with specific examples, and other advantages and effects of the present invention will be readily apparent to those skilled in the art from the disclosure in the specification. The present invention may also be carried out or applied in other different specific embodiments, and various modifications or changes may also be made to the details in the specification based on different ideas and applications without departing from the spirit of the present invention. It is to be noted that the following embodiments and features in the embodiments may be combined with each other if no conflicts will result.

It is to be noted that drawings provided in the following embodiments only schematically illustrate the basic idea of the present invention, so the drawings only show components related to the present invention, and are not drawn according to the numbers, shapes and sizes of the components in actual implementation; the forms, numbers and proportions of the components in actual implementation may be adjusted as needed; and the layout of the components may be more complex.

Figure 1:
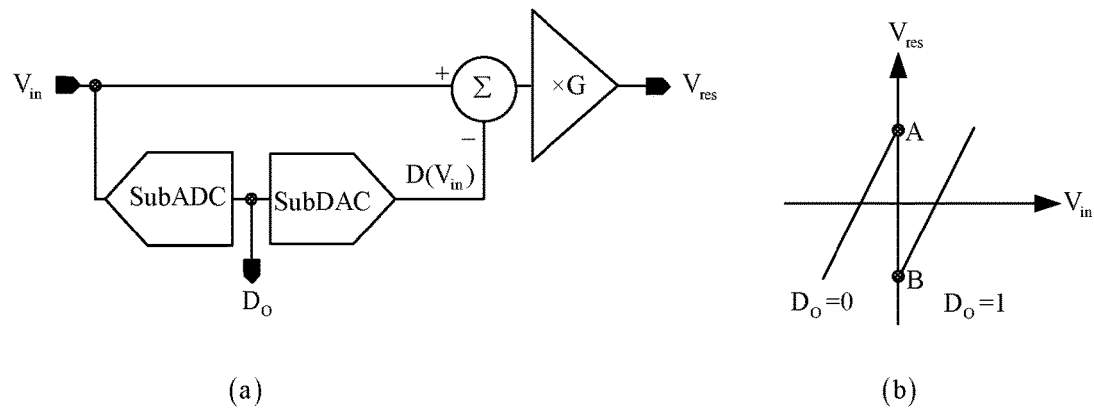
FIG. 1-(a) is a functional block diagram of a sub-pipeline provided in the present invention.
Figure 2:
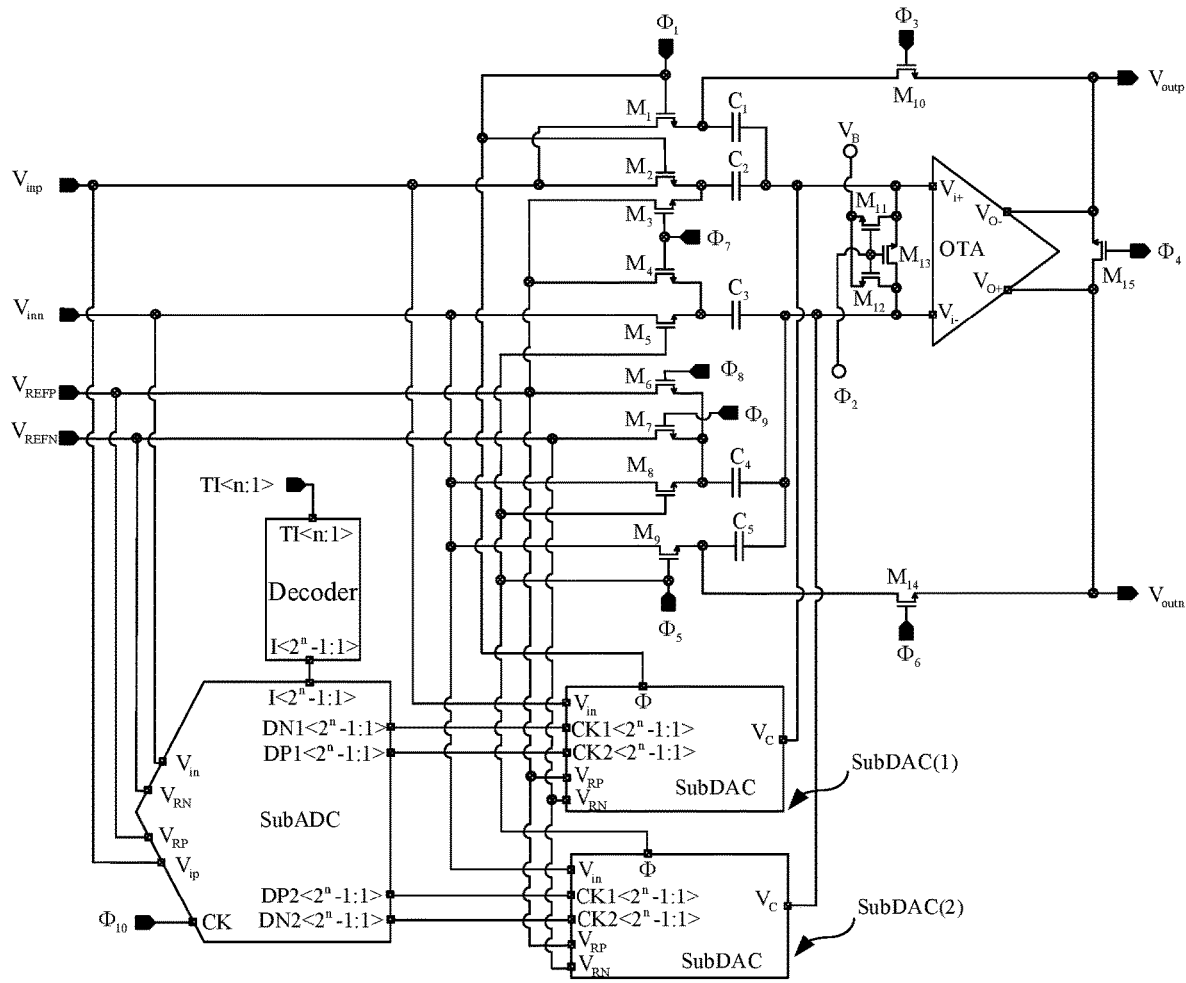
FIG. 2 is a general diagram of a sub-pipeline with a function of measuring a magnitude of a transmission curve provided in the present invention.

Referring to FIG. 2, which is a general diagram of a sub-pipeline with a function of measuring a magnitude of a transmission curve provided in the present invention, the sub-pipeline includes:

a sub-analog-to-digital converter having n-bit resolution (i.e., SubADC, or Sub-A/D converter) configured to quantize input analog voltage signals under a clock signal and a digital control signal and output digital voltage signals, respectively, wherein the analog voltage signals include an in-phase analog voltage signal $V_{inp}$ and an inverted analog voltage signal $V_{inn}$; and a positive reference voltage $V_{REFP}$ and a negative reference voltage $V_{REFN}$;

a first sub-digital-to-analog converter and a second sub-digital-to-analog converter (SubDAC, or Sub-D/A converter) having n-bit resolution, each configured to correspondingly convert the digital voltage signals output by the sub-analog-to-digital converter into corresponding analog voltage signals, respectively;

a decoder having n-bit resolution configured to decode an n-bit binary input signal and output the digital control signal; and a switched-capacitor amplification unit configured to, when in a normal mode, perform sampling and residue amplification on the input analog voltage signals; and when in a test mode, measure the jump magnitude of the transmission curve corresponding to each decision level.

From the standpoint of a developer, the modes may be construed as the normal mode and the test mode. However, for a user, by introducing the n-bit input decoder unit, introducing a NON gate G1 and tri-state NON gates G2 and G3 in a comparator output buffer, and allowing MOS switches M6 and M7 of the switched-capacitor amplification unit to have different operating states in the normal mode and the test mode, the sub-pipeline structure not only can perform common analog-to-digital conversion and residual amplification functions, but also can effectively measure the jump magnitude of the transmission curve corresponding to each decision level to improve the linearity of the time-interleaved analog-to-digital converter when analog input signals have high-frequencies.

Figure 3:
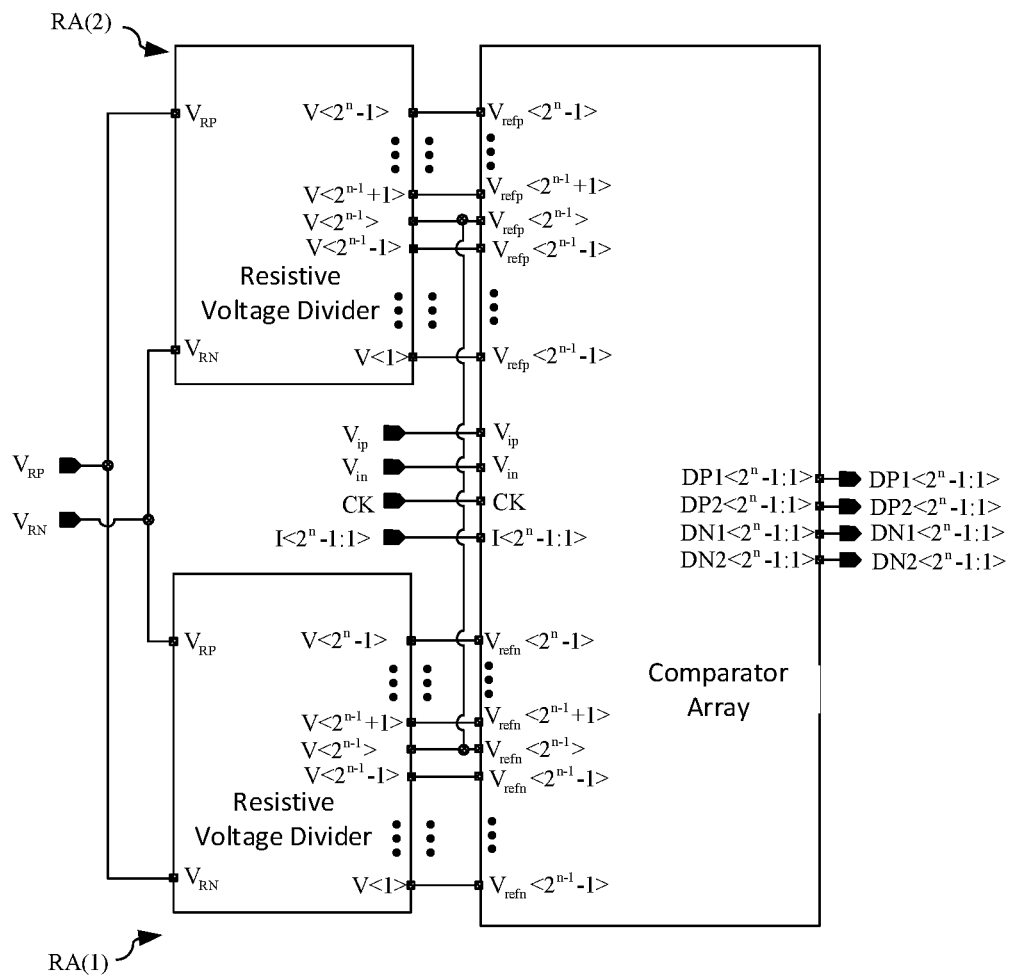
FIG. 3 is a circuit diagram of a sub-A/D converter having n-bit resolution provided in the present invention.

In the above embodiment, as shown in FIG. 3, which illustrates a sub-A/D converter having n-bit resolution provided in the present invention, the sub-A/D converter includes:

at least two resistive voltage dividers, configured to provide $2^n-1$ positive reference voltages and $2^n-1$ negative reference voltages, respectively, to a comparator array; and a comparator array connected to the at least two resistive voltage dividers, to compare the input in-phase analog voltage signal $V_{inp}$ and inverted analog voltage signal $V_{inn}$ with the $2^n-1$ positive reference voltages and $2^n-1$ negative reference voltages, respectively, and quantize the analog voltage signals and output $2^n-1$ digital voltage signals at each of four ports.

Figure 4:
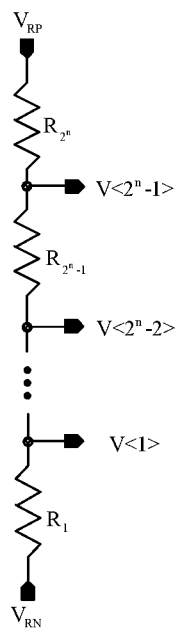
FIG. 4 is a diagram of a resistive voltage divider provided in the present invention.

Specifically, as shown in FIG. 4, which illustrates one of the at least two resistive voltage dividers, which includes an input terminal $V_{RN}$, an input terminal $V_{RP}$, $2^n$ resistors and $2^n-1$ output terminals, where n is a natural number greater than zero; one end of a first resistor R1 is connected to the input terminal $V_{RN}$ connected to the negative reference voltage $V_{REFN}$, and the other end of the first resistor R1 is connected to a first output terminal, and so on; and a $(2n^{-1})$th output terminal is connected between a $(2^n)$th resistor $R2^n$ and a $(2^{n-1})$th resistor $R2^{n-1}$, and the other end of the $(2^n)$th resistor $R2^n$ is connected to the input terminal $V_{RP}$ connected to the positive reference voltage $V_{REFP}$. In addition, each resistor $R_i$ (i=2, . . . , $2^n-1$) has a same designed resistance value which is equal to R ohms, and the resistor $R_1$ and the resistor $R_2^n$ have the same resistance design value which is equal to $(2^n-2^{n-1}+1) \times R$ ohms.

Figure 5:
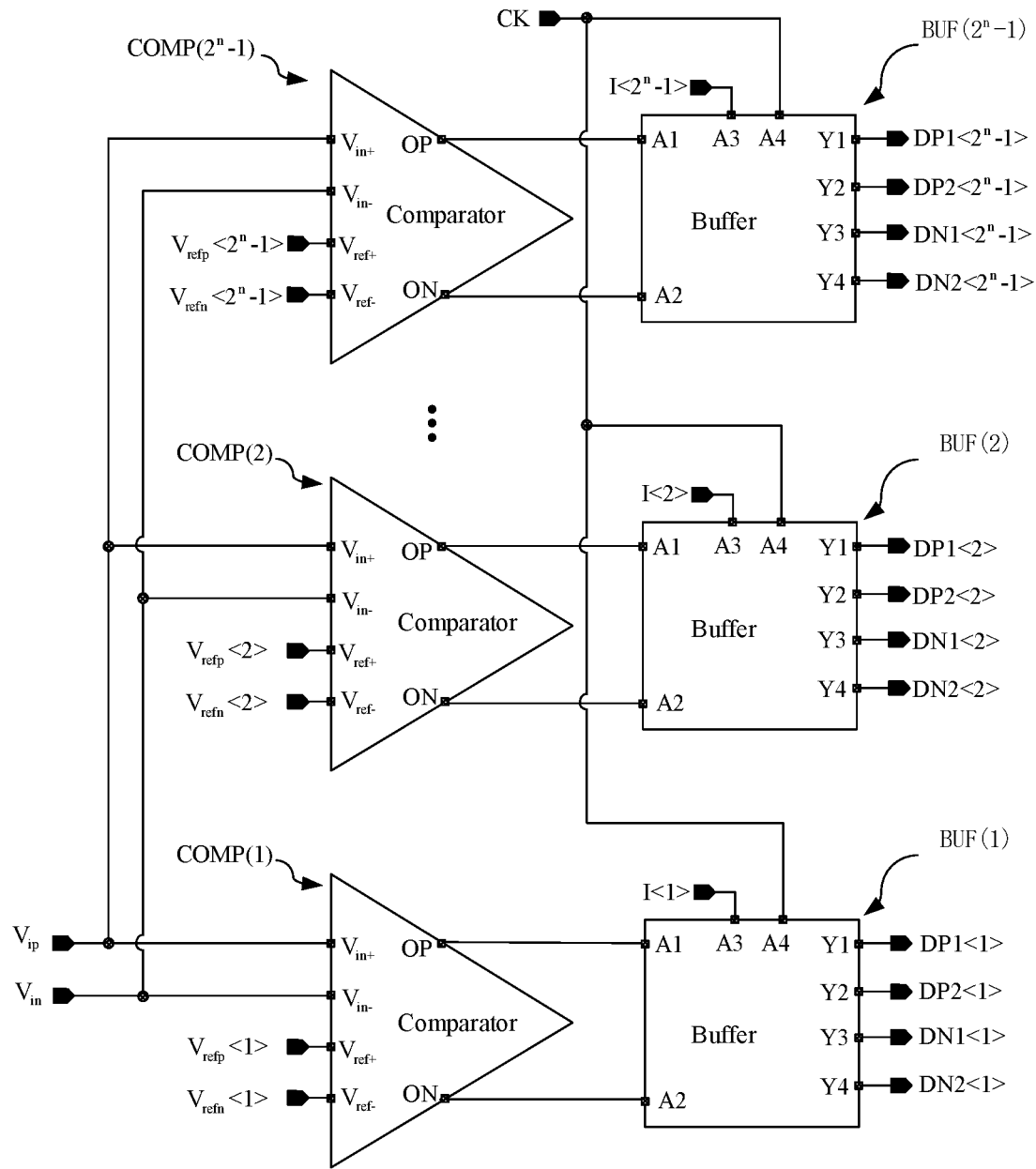
FIG. 5 is a diagram of a comparator array with a buffer array provided in the present invention.

Specifically, as shown in FIG. 5, which is a diagram of the comparator array with a buffer array, provided in the present invention, detailed description is as follows:

The comparator array includes $2^n-1$ comparators, and $2^n-1$ buffers which form a buffer array.

Each comparator has a first input terminal $V_{in+}$ connected to the in-phase analog voltage $V_{inp}$, a second input terminal $V_{in+}$ connected to the inverted analog voltage $V_{inn}$, a third input terminal $V_{ref+}$ connected to the positive reference voltage $V_{REFP}$, and a fourth input terminal $V_{ref-}$ connected to the negative reference voltage $V_{REFN}$, to compare the magnitudes of the input analog voltages with those of the reference voltages, and correspondingly output, at a first output terminal OP and a second output terminal ON thereof, an in-phase digital voltage signal and an inverted digital voltage signal; specifically, the comparator is a fully differential comparator, and may be a comparator with a switched-capacitor structure or a dynamic comparator.

Each buffer is an output buffer for a corresponding comparator of the comparator array, and each buffer has a first input terminal and a second input terminal correspondingly connected to the in-phase digital voltage signal and the inverted digital voltage signal output by a corresponding comparator, a third input terminal connected to the digital control signal in the sub-A/D converter, and a fourth input terminal connected to the clock signal, wherein the buffer provides drive and test capabilities for switches in the sub-D/A converters, and outputs digital voltage signals at a first output terminal, a second output terminal, a third output terminal, and a fourth output terminal thereof.

In one embodiment, by changing the resolution of the sub-A/D converter, the number of comparators in the sub-A/D converter and ratios between capacitors in the switched-capacitor amplification unit, the present invention can implement a multi-bit sub-pipeline with a redundancy function, in which the A/D converter has a logic calibration function, which provides flexibility when designing the converter.

Figure 6:
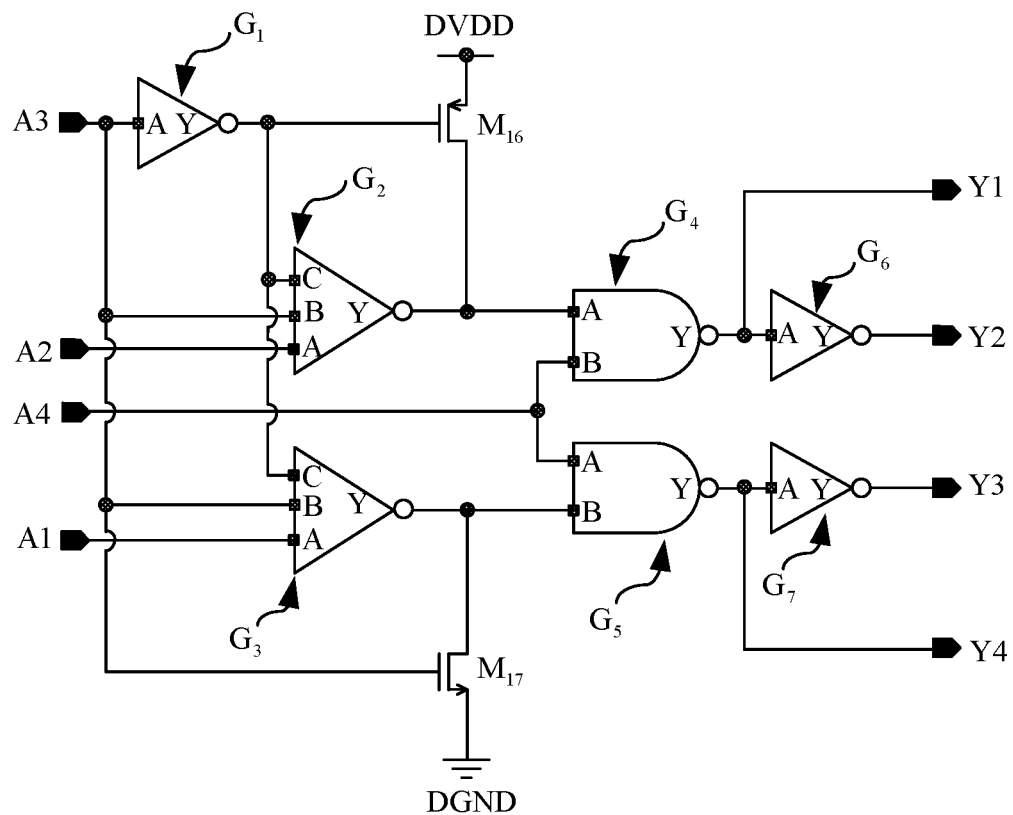
FIG. 6 is a circuit diagram of an output buffer of a comparator provided in the present invention.

Specifically, as shown in FIG. 6, which is a diagram of an output buffer of a comparator provided in the present invention, each buffer includes a first NOT gate G1, a second NOT gate G6, a third NOT gate G7, a first tri-state NOT gate G2, a second tri-state NOT gate G3, a first NAND gate G4, a second NAND gate G5, a PMOS transistor $M_{16}$ and an NMOS transistor $M_{17}$; the third input terminal of the buffer is connected to an input terminal of the first NOT gate, an input terminal B of the first tri-state NOT gate, an input terminal B of the second tri-state NOT gate and a gate of the NMOS transistor $M_{17}$, and an output terminal of the first NOT gate is connected to an input terminal C of the first tri-state NOT gate, an input terminal C of the second tri-state NOT gate and a gate of PMOS transistor $M_{16}$; an input terminal A of the first tri-state NOT gate and an input terminal A of the second tri-state NOT gate are correspondingly connected to the second input terminal and the first input terminal of the buffer; an output terminal of the first tri-state NOT gate is connected to a drain of the PMOS transistor $M_{16}$ and an input terminal A of the first NAND gate, and an output terminal of the second tri-state NOT gate is connected to a drain of the PMOS transistor $M_{17}$ and an input terminal B of the second NAND gate; wherein a source of the PMOS transistor $M_{16}$ is connected to a digital power supply, and a source of the NMOS transistor $M_{17}$ is grounded; the fourth input terminal of the buffer is connected to the input terminal B of the first NAND gate and an input terminal A of the second NAND gate; the first NAND gate outputs a first digital voltage signal Y1, and the first digital voltage signal Y1 is processed by the second NOT gate to output a second digital voltage signal Y2; and the second NAND gate outputs a fourth digital voltage signal Y4, and the fourth digital voltage signal Y4 is processed by the third NOT gate to output a third digital voltage signal Y3.

Figure 7:
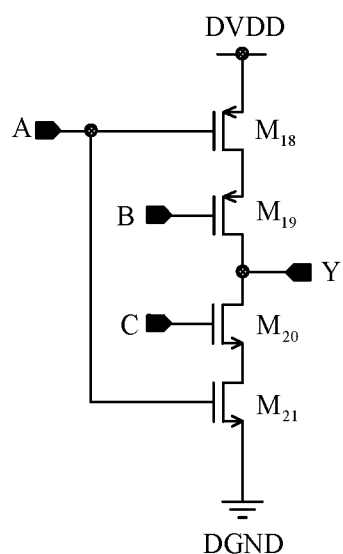
FIG. 7 is a circuit diagram of a tri-state output NOT gate provided in the present invention.

Specifically, as shown in FIG. 7, which is a circuit diagram of a tri-state NOT gate provided in the present invention, the tri-state NOT gate includes PMOS transistors $M_{18}$ and $M_{19}$, and NMOS transistors $M_{20}$ and $M_{21}$; the input terminal A of the tri-state NOT gate is connected to gates of the PMOS transistor $M_{18}$ and the NMOS transistor $M_{21}$, and the input terminal B of the tri-state NOT gate is connected to a gate of the PMOS transistor $M_{19}$, and the input terminal C of the tri-state NOT gate is connected to a gate of the NMOS transistor $M_{20}$; a source of the PMOS transistor $M_{18}$ is connected to the digital power supply and a drain thereof is connected to a source of the PMOS transistor $M_{19}$, and drains of the PMOS transistor $M_{19}$ and the NMOS transistor $M_{20}$ are interconnected and serve as the output terminal of the tri-state NOT gate; and a source of the NMOS transistor $M_{20}$ is connected to a drain of the NMOS transistor $M_{21}$, and a source of the NMOS transistor $M_{21}$ is grounded.

In this embodiment, by introducing the NOT gate $G_1$, the tri-state NOT gate $G_2$ and the tri-state NOT gate $G_3$ as well as the control signal A3 into the output buffer of a comparator, the, so that the input to each switched-capacitor DA unit in the sub-D/A converters in a holding stage is either the positive reference voltage $V_{REFP}$ or the negative reference voltage $V_{REFN}$. All these functions are implemented in the digital domain in a simple and flexible manner without increasing the design complexity in the analog domain.

In addition, the comparator in the sub-A/D converter of the present invention may be a comparator with a switched-capacitor structure or a dynamic comparator, and thus the present invention is applicable to a pipelined A/D converter without a sample-and-hold structure and a pipelined A/D converter with a sample-and-hold structure.

Figure 8:
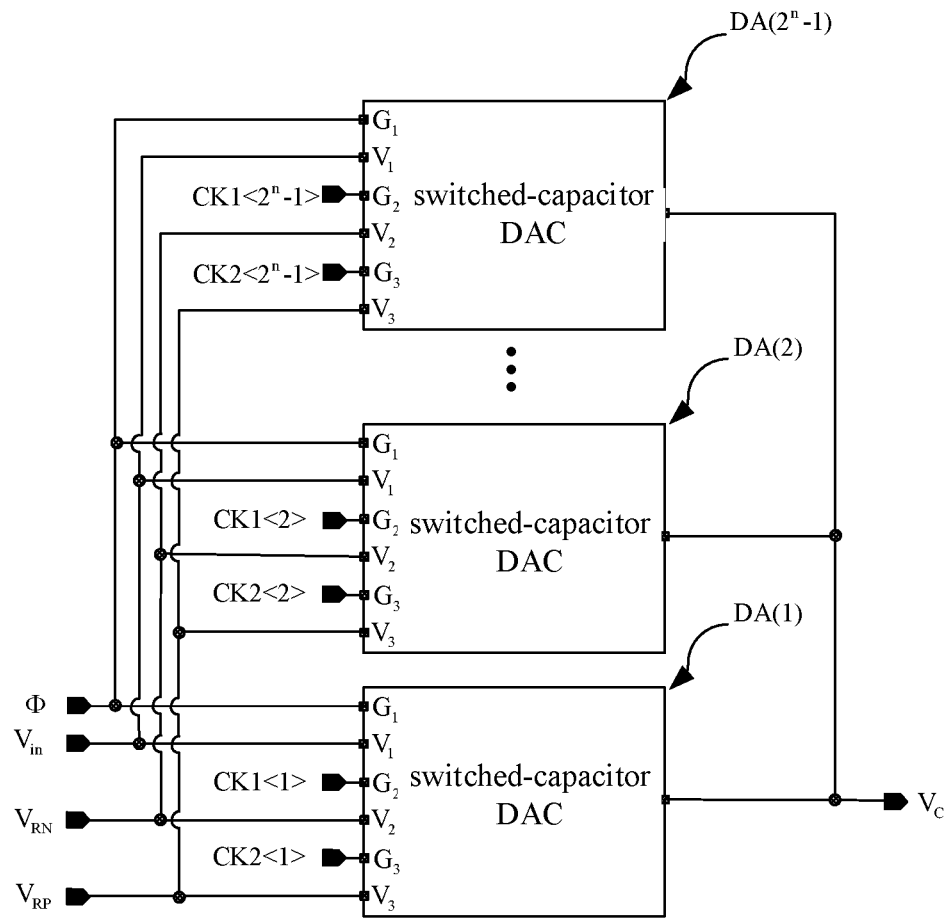
FIG. 8 is a circuit diagram of a sub-D/A converter provided in the present invention.

Referring to FIG. 8, which is a circuit diagram of a sub-D/A converter provided in the present invention, which includes a first sub-digital-to-analog converter and the second sub-digital-to-analog converter.

The first sub-D/A converter and the second sub-D/A converter are each configured to perform digital-to-analog conversion on the input digital voltage signals, have input terminals $G_1$, $G_2$ and $G_3$ as digital voltage signal input terminals, input terminals $V_1$ as analog voltage signal input terminals, and input terminals $V_2$ and $V_3$ as reference voltage signal input terminals; and each sub-analog-to-digital converter includes $2^n-1$ switched-capacitor DAC units, and each switched-capacitor DAC unit includes input terminals $G_1$, $G_2$, $G_3$, $V_1$, $V_2$, and $V_3$.

The input terminal $G_1$ of an ith switched-capacitor DAC unit DA(i) (i=1, . . . , $2^n-1$) is connected to an input terminal Φ, the input terminal $V_1$ of the ith switched-capacitor DAC unit DA(i) is connected to an input terminal $V_{in}$, the input terminal $G_2$ of the ith switched-capacitor DAC unit DA(i) is connected to an input terminal CK1<i>, the input terminal $V_2$ of the ith switched-capacitor DAC unit DA(i) is connected to an input terminal $V_{RN}$, the input terminal $G_3$ of the ith switched-capacitor DAC unit DA(i) is connected to an input terminal CK2<i>, the input terminal $V_3$ of the ith switched-capacitor DAC unit DA(i) is connected to an input terminal $V_{RP}$, and an output terminal D of the ith switched-capacitor DAC unit DA(i) is connected to an output terminal $V_C$.

Figure 9:
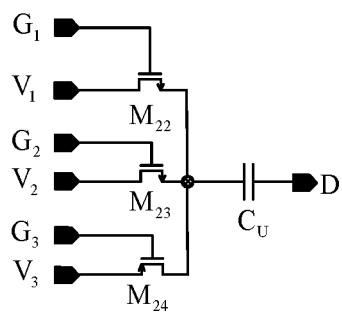
FIG. 9 is a circuit diagram of a switched-capacitor D/A converter provided in the present invention.

Specifically, as shown in FIG. 9, which is a circuit diagram of a switched-capacitor DAC provided in the present invention, the switched-capacitor DAC unit includes NMOS switching transistors $M_{22}$ and $M_{23}$, a PMOS switching transistor $M_{24}$, and a capacitor $C_U$; the digital voltage signal input terminals $G_1$, $G_2$ and $G_3$ of the switched-capacitor DAC unit are correspondingly connected to gates of the NMOS switching transistors $M_{22}$ and $M_{23}$ and the PMOS switching transistor $M_{24}$; the analog voltage signal input terminals $V_1$ and $V_2$ of the switched-capacitor DAC unit are correspondingly connected to drains of the NMOS switching transistors $M_{22}$ and $M_{23}$, and the analog voltage signal input terminal $V_3$ of the switched-capacitor DAC unit is connected to a source of PMOS switching transistor $M_{24}$; and sources of the NMOS switching transistors $M_{22}$ and $M_{23}$ and the drain of the PMOS switching transistor $M_{24}$ are jointly connected to the capacitor $C_U$, and the other end of the capacitor $C_U$ is the output terminal of switched-capacitor DAC unit.

Specifically, as shown in FIG. 2, the first sub-D/A converter and the second sub-D/A converter are respectively connected to the sub-A/D converter as follows:

The first sub-D/A converter includes an input terminal $V_{in}$ connected to the in-phase analog voltage signal $V_{inp}$, an input terminal $V_{RP}$ connected to the positive reference voltage $V_{REFP}$, an input terminal $V_{RN}$ connected to the negative reference voltage $V_{REFN}$, and clock input terminals connected to clock control signals; and based on inputs of $2^n-1$ digital control signals from each of two output terminals DN1 and DP1, the first sub-D/A converter outputs $2^n-1$ digital output voltage signals according to the clock control signals; and The second sub-D/A converter includes an input terminal $V_{in}$ connected to the inverted analog voltage signal $V_{inn}$, an input terminal $V_{in}$ connected to the inverted analog voltage signal $V_{inn}$, an input terminal $V_{RP}$ connected to the positive reference voltage $V_{REFP}$, an input terminal $V_{RN}$ connected to the negative reference voltage $V_{REFP}$, and clock input terminals connected to clock control signals; and based on inputs of $2^n-1$ digital control signals from each of two output terminals DN2 and DP2, the second sub-D/A converter outputs $2^n-1$ digital output voltage signals according to the clock signals.

Specifically, as shown in FIG. 2, the switched-capacitor amplification unit includes sampling capacitors $C_1$, $C_2$, $C_3$, $C_4$ and $C_5$, NMOS switches $M_1$, $M_2$, $M_3$, $M_4$, $M_5$, $M_6$, $M_7$, $M_8$, $M_9$, $M_{10}$, $M_{11}$, $M_{12}$, $M_{13}$, $M_{14}$ and $M_{15}$, and a fully differential operational amplifier OTA, wherein one end of the capacitor $C_1$ is connected to an in-phase input terminal $V_{1+}$ of the fully differential operational amplifier OTA, and the other end of the capacitor $C_1$ is connected to a source of the MOS switch $M_1$ and a drain of $M_{10}$; one end of the capacitor $C_2$ is connected to the in-phase input terminal $V_{1+}$ of the fully differential operational amplifier OTA, and the other end of the capacitor $C_2$ is connected to a source of the MOS switch $M_2$ and a source of $M_3$; one end of the capacitor $C_3$ is connected to an inverted input terminal Vi− of the operational amplifier, and the other end of the capacitor $C_3$ is connected to a source of the MOS switch $M_4$ and a source of $M_5$; one end of the capacitor $C_4$ is connected to the inverted input terminal of the operational amplifier, and the other end of the capacitor $C_4$ is connected to a source of the MOS switch $M_6$, a source of $M_7$ and a source of $M_8$; one end of the capacitor $C_5$ is connected to the inverted input terminal $V_{i-}$ of the fully differential operational amplifier OTA, and the other end of the capacitor C5 is connected to a source of the MOS switch $M_9$ and a drain of $M_{14}$; the in-phase analog voltage signal $V_{inp}$ is connected to drains of the NMOS switches $M_1$ and $M_2$; drains of the NMOS switches $M_3$ and $M_4$ are connected to the positive reference voltage $V_{REFP}$; the inverted analog voltage signal $V_{inn}$ is connected to drains of the NMOS switches $M_5$, $M_8$ and $M_8$; the positive reference voltage $V_{REFP}$ is connected to a drain of the NMOS switch $M_6$; the negative reference voltage $V_{REFN}$ is connected to a drain of the NMOS switch $M_7$; a drain of NMOS switch $M_{11}$ and a source of $M_{13}$ are connected to the in-phase input terminal $V_{1+}$ of the fully differential operational amplifier OTA; a drain of the NMOS switch $M_{12}$ and a drain of $M_{13}$ are connected to the inverted input terminal of the operational amplifier OTA; sources of the NMOS switches $M_{11}$ and $M_{12}$ are connected to an input terminal $V_B$; a source of the NMOS switch $M_{10}$ and a source of $M_{15}$ are connected to an output $V_{outp}$; a source of the NMOS switch $M_{14}$ and a drain of $M_{15}$ are connected to an output $V_{outn}$; an input terminal $\Phi_1$ is connected to gates of the NMOS switches $M_1$ and $M_2$; an input terminal $\Phi 7$ is connected to gates of the NMOS switches $M_3$ and $M_4$; an input terminal $\Phi_5$ is connected to gates of the NMOS switches $M_5$, $M_8$ and $M_9$; an input terminal $\Phi_8$ is connected to a gate of the NMOS switch $M_6$; an input terminal $\Phi_9$ is connected to a gate of the NMOS switch $M_7$; an input terminal $\Phi_3$ is connected to a gate of the NMOS switch $M_{10}$; an input terminal $\Phi_4$ is connected to a gate of the NMOS switch $M_{15}$; an input terminal $\Phi_6$ is connected to a gate of the NMOS switch $M_{14}$; and an input terminal $\Phi_2$ is connected to gates of the NMOS switches $M_{11}$, $M_{12}$ and $M_{13}$.

Specifically, the capacitance value of the capacitor $C_2$ is equal to the sum of the capacitance values of the capacitor $C_3$ and the capacitor $C_4$, and the capacitance values of $C_3$ and $C_4$ are equal to ensure that normal residual amplification can be achieved in the normal mode (operating mode) and the jump magnitude can be measured in the test mode, as described below; and the fully differential operational amplifier OTA as used herein is a conventional high-precision high-speed operational amplifier.

In the above embodiment, the decoder is an n-bit decoder (n is the resolution of the sub-A/D converter), and the decoder has n inputs and only $2^n-1$ outputs; TI<n> is the highest bit, and TI<1> is the lowest bit; when the decimal representation of the decoder input TI<n:1> is equal to zero, the $2^n-1$ outputs I<$2^n-1$> ... I<1> are all at a zero level; and when the decimal representation of the decoder input TI<n:1> is equal to i (i=1, ..., $2^n-1$), the ith output I<i> of the decoder is equal to a high level, and the rest $2^n-2$ outputs I<$2^n-1$> ... I<i+1>I<i-1> ... I<1> are all at a zero level. In normal/operating mode of the sub-pipeline, the n inputs of the decoder are all zero levels; in the test mode of the sub-pipeline, the inputs of the decoder traverse all logic input values, for a total of $2^n$ states.

Figure 10:
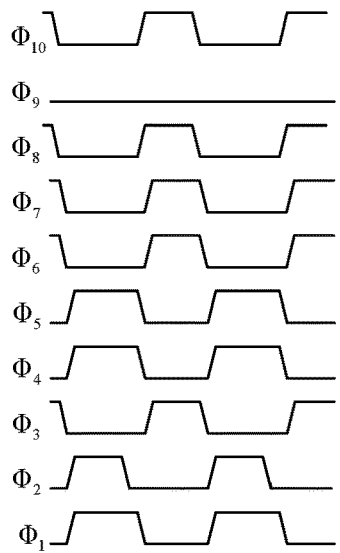
FIG. 10 is an operating timing diagram in a normal mode provided in the present invention.

A schematic diagram of an operating timing relationship of the NMOS switches in the normal/operating mode of the present invention is shown in FIG. 10, in which clock control signals $\Phi_1$, $\Phi_2$, $\Phi_4$ and $\Phi_5$ are in the same phase, and clock control signals $\Phi_3$, $\Phi_6$, $\Phi_7$, $\Phi_8$ and $\Phi_{10}$ are in the same phase, and $\Phi_9$ is always at a zero level, and in this mode:

When $\Phi_1$, $\Phi_2$, $\Phi_4$ and $\Phi_5$ are at a high level, the $2^n-1$ outputs DP1<$2^n-1$> ... DP1<1> and the $2^n-1$ outputs DN2<$2^n-1$> ... DN2<1> of the sub-A/D converter are all at a high level, and the $2^n-1$ outputs DP2<$2^n-1$> ... DP2<1> and the $2^n-1$ outputs DN1<$2^n-1$> ... DN1<1> of the sub-A/D converter are all at a low level; the NMOS switches $M_1$, $M_2$, $M_5$, $M_8$, $M_9$, $M_{11}$, $M_{12}$, $M_{13}$ and $M_{15}$ in the switched-capacitor amplification unit are on, and the NMOS transistors $M_3$, $M_4$, $M_6$, $M_7$, $M_{10}$ and $M_{14}$ in the switched-capacitor amplification unit are off; an in-phase analog voltage input signal $V_{inp}$ is transmitted to one end of the sampling capacitor $C_1$ through the NMOS switch $M_1$ and to one end of the sampling capacitor $C_2$ through the NMOS switch $M_2$; an inverted analog voltage input signal $V_{inn}$ is transmitted to one end of the sampling capacitor $C_3$ through the NMOS switch $M_5$, to one end of the sampling capacitor $C_4$ through the NMOS switch $M_8$ and to one end of the sampling capacitor $C_5$ through the NMOS switch $M_9$; a bias voltage $V_B$ is transmitted to the other ends of the sampling capacitors $C_1$ and $C_2$ and the in-phase input terminal $V_{1+}$ of the fully differential operational amplifier OTA through the NMOS switch $M_{11}$, wherein the other ends of the sampling capacitors $C_1$ and $C_2$ are connected to each other, and the bias voltage $V_B$ is transmitted to the other ends of the sampling capacitors $C_3$, $C_4$ and $C_5$ and the inverted input terminal $V_{i-}$ of the fully differential operational amplifier OTA through the NMOS switch $M_{12}$, wherein the other ends of the sampling capacitor $C_3$, $C_4$ and $C_5$ are connected to each other; the in-phase output terminal $V_{outp}$ of the fully differential operational amplifier OTA is shorted to the inverted output terminal $V_{outn}$ of the fully differential operational amplifier OTA through the NMOS switch $M_{15}$, so the switched capacitor amplification unit differentially outputs a voltage signal $V_{outp} - V_{outn} = 0V$; at the same time, the in-phase analog voltage input signal $V_{inp}$ is transmitted to the sampling capacitor $C_U$ through the NMOS switches in each switched-capacitor DAC unit in the first sub-D/A converter SubDAC(1); and the inverted analog voltage input signal $V_{inn}$ is transmitted to the sampling capacitor $C_U$ through the NMOS switches in each switched-capacitor DAC unit in the second sub-digital-to-analog converter SubDAC(2).

When $\Phi_1$, $\Phi_2$, $\Phi_4$ and $\Phi_5$ are at a low level, the $2^n-1$ outputs DP1<$2^n-1$> ... DP1<1>, the $2^n-1$ outputs DP2<$2^n-1$> ... DP2<1>, the $2^n-1$ outputs DN1<$2^n-1$> ... DN1<1> and the $2^n-1$ outputs DN1<$2^n-1$>DN1<1> of the sub-A/D converter are determined by the amplitudes of input signals; in the switched-capacitor amplification unit, the NMOS switches $M_3$, $M_4$, $M_6$, $M_{10}$ and $M_{14}$ are on, and the NMOS switches $M_1$, $M_2$, $M_5$, $M_7$, $M_8$, $M_9$, $M_{11}$, $M_{12}$, $M_{13}$ and $M_{15}$ are off; the positive reference voltage $V_{REFP}$ is transmitted to one end of the sampling capacitor $C_2$ through the NMOS switch $M_3$, to one end of the sampling capacitor $C_3$ through the NMOS switch $M_4$ and to one end of the sampling capacitor $C_4$ through the NMOS switch $M_6$; one end of the sampling capacitor $C_1$ connected to the source of the NMOS transistor $M_1$ is connected to the in-phase output terminal $V_{outp}$ through the NMOS switch $M_{10}$, and one end of the sampling capacitor $C_5$ connected to the source of the NMOS transistor $M_9$ is connected to the inverted output terminal $V_{outn}$ through the NMOS switch $M_{14}$; and according to the principle of charge conservation, in this case, the switched-capacitor amplification unit differentially outputs a voltage signal $V_{outp} - V_{outn}$ given by:

$$V_{outp} - V_{outn} = \qquad (1)$$

$$\left( \frac{C_1 + C_2 + \sum_{i=1}^{2^n-1} C_{U,1i}}{C_1} V_{inp} - \frac{C_3 + C_4 + C_5 + \sum_{i=1}^{2^n-1} C_{U,2i}}{C_5} V_{inn} \right) -$$

$$\left( \frac{\sum_{i=1}^{k} C_{U,1i}}{C_1} - \frac{\sum_{i=k+1}^{2^n-1} C_{U,2i}}{C_5} \right) \times V_{REFP} -$$

$$\left( \frac{\sum_{i=k+1}^{2^n-1} C_{U,1i}}{C_1} - \frac{\sum_{i=1}^{k} C_{U,2i}}{C_5} \right) \times V_{REFN}.$$

In equation (1), $C_1$ is the capacitance value of the capacitor $C_1$; $C_2$ is the capacitance value of the capacitor $C_2$; $C_3$ is the capacitance value of the capacitor $C_3$; $C_4$ is the capacitance value of the capacitor $C_4$; $C_5$ is the capacitance value of capacitor $C_5$; $C_{U,1i}$ indicates the value of the sampling capacitor $C_U$ in the ith switched-capacitor DA unit in the first sub-D/A converter SubDAC(1); $C_{U,2i}$ indicates the value of the sampling capacitor $C_U$ in the ith switched-capacitor DA unit in the second sub-D/A converter SubDAC(2); and k indicates that when $\Phi_{10}$ is equal to a high level, only the in-phase output terminals of the 1st, $2^{nd}$, ..., and kth comparators in the comparator array are at a high level.

Figure 11:
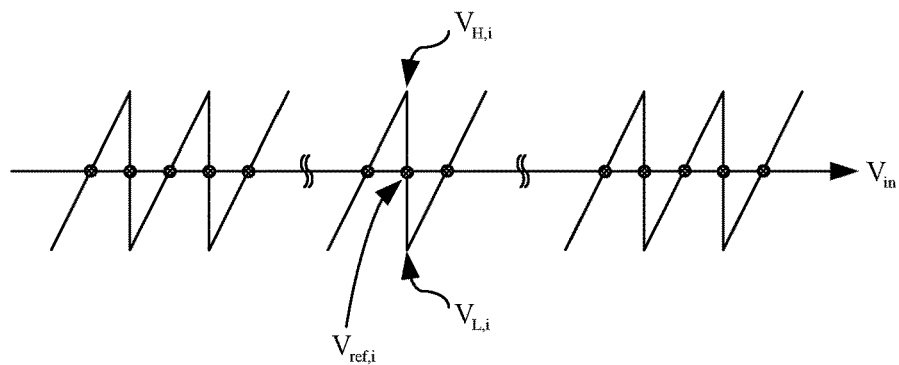
FIG. 11 is a schematic diagram of a typical transmission curve provided in the present invention.

An ideal transmission curve of the sub-pipeline, as shown in FIG. 11, has a jump at each decision level, and the jump magnitude at the ith decision level is given by:

$$V_{H,i} - V_{L,i} = \left( \frac{C_{U,1i}}{C_1} + \frac{C_{U,2i}}{C_5} \right) \times (V_{REFP} - V_{REFN}). \qquad (2)$$

Figure 12:
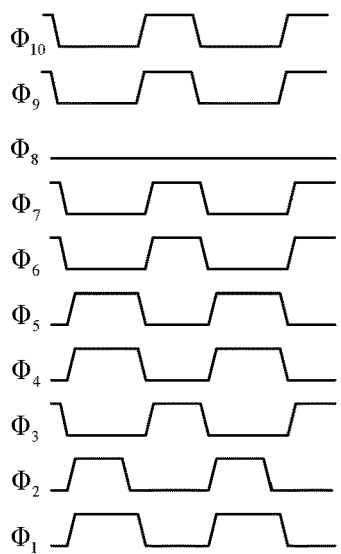
FIG. 12 is an operating timing diagram in a test mode provided in the present invention.

A schematic diagram of an operating timing relationship of the NMOS switches in the test mode of the present invention is shown in FIG. 12, in which clock control signals $\Phi_1$, $\Phi_2$, $\Phi_4$ and $\Phi_5$ are in the same phase, and clock control signals $\Phi_3$, $\Phi_6$, $\Phi_7$, $\Phi_9$ and $\Phi_{10}$ are in the same phase, and $\Phi_8$ is always at a zero level. In this mode, the in-phase analog input voltage signal $V_{inp}$ is fixed at $-(V_{REFP} - V_{REFN})/2^n$ and the inverted analog input voltage signal $V_{inn}$ is fixed at $-(V_{REFP} - V_{REFN})/2^n + 1$; when the decimal representation of the decoder input signal TI<n:1> is equal to 0 and $\Phi_{10}$ is equal to a high level, the $2^n-1$ outputs DP1<$2^n-1:1$> and the $2^n-1$ outputs DN2<$2^n-1:1$> of the comparator array are all at a high level, and the $2^n-1$ outputs DP2<$2^n-1:1$> and the $2^n-1$ outputs DN1<$2^n-1:1$> are all at a high level; and when the decimal representation of the decoder input signal TI<n:1> is equal to i (i=1, ..., $2^n-1$) and $\Phi_{10}$ is equal to a high level, the outputs DP2<i> and DN2<i> of the ith comparator in the comparator array are both at a high level and the outputs DP1<i> and DN1<i> thereof are both at a zero level, and among the rest outputs, the outputs DP2<$2^n-1$> ... DP2<i+1>DP2<i-1> ... DP2<1> and DN2<$2^n-1$> ... DN2<i+1>DN2<i-1> ... DN2<1> of the comparator array are all at a zero level, and the outputs DP1<$2^n-1$> ... DP2<i+1> DP2<i-1> ... DP2<1> and DN1<$2^n-1$> ... DN1<i+1>DN1<i-1> ... DN1<1> are all at a high level. In the test mode:

when $\Phi_1$, $\Phi_2$, $\Phi_4$ and $\Phi_5$ are at a high level, the states of the NMOS switches in the sub-D/A converters and the NMOS switches in the switched-capacitor amplification unit and the transmission characteristics of the input analog voltage signals are exactly the same as the states of the NMOS switches in the sub-D/A converters and the NMOS switches in the switched-capacitor amplification unit and the transmission characteristics of the input analog voltage signals in the normal mode, which will not be repeatedly described here; and when $\Phi_1$, $\Phi_2$, $\Phi_4$ and $\Phi_5$ are at a low level, the NMOS switch $M_6$ is off and the NMOS switch $M_7$ is on in the switched-capacitor amplification unit, and the negative reference voltage $V_{REFN}$ is transmitted to one end of the sampling capacitor $C_4$ through the MOS switch $M_7$, and the states of the rest NMOS switches in the sub-D/A converter and the rest NMOS switches in the switched-capacitor amplification unit and the transmission characteristics of the input analog voltage signals are the same as the states of the rest NMOS switches in the sub-D/A converter and the rest NMOS switches in the switched-capacitor amplification unit and the transmission characteristics of the input analog voltage signals in the normal mode, which will not be repeated here; and according to the principle of charge conservation, in this case, when the decimal representation of the decoder input TI<n:1> is equal to 0, the switched-capacitor amplification unit differentially outputs a voltage signal $V_{outp} - V_{outn}$ as expressed by equation (3), and when the decimal representation of the decoder input TI<n:1> is equal to i (i=1, . . . , $2^n-1$), the switched-capacitor amplification unit differentially outputs a voltage signal $V_{outp} - V_{outn}$ as expressed by equation (4):

$$V_{outp} - V_{outn} = \left( -\frac{C_1 + C_2 + \sum_{j=1}^{2^n-1} C_{U,1j}}{C_1} \cdot \frac{V_{REFP} - V_{REFN}}{2^n} + \frac{C_3 + C_4 + C_5 + \sum_{j=1}^{2^n-1} C_{U,2j}}{C_5} \cdot \frac{V_{REFP} - V_{REFN}}{2^{n+1}} \right) + \left( \frac{C_2}{C_1} - \frac{C_3}{C_5} \right) \times V_{REFP} + \frac{C_4}{C_5} \times V_{REFN} - \left( -\frac{\sum_{j=1}^{2^n-1} C_{U,2j}}{C_5} \right) \times V_{REFP} - \left( \frac{\sum_{j=1}^{2^n-1} C_{U,1j}}{C_1} \right) \times V_{REFN} \tag{3}$$

and $$V_{outp} - V_{outn} = \left( -\frac{C_1 + C_2 + \sum_{j=1}^{2^n-1} C_{U,1j}}{C_1} \cdot \frac{V_{REFP} - V_{REFN}}{2^n} + \frac{C_3 + C_4 + C_5 + \sum_{j=1}^{2^n-1} C_{U,2j}}{C_5} \cdot \frac{V_{REFP} - V_{REFN}}{2^{n+1}} \right) + \left( \frac{C_2}{C_1} - \frac{C_3}{C_5} \right) \times V_{REFP} + \frac{C_4}{C_5} \times V_{REFN} - \left( \frac{C_{U,1j}}{C_1} - \frac{\sum_{j=1,j\ne i}^{2^n-1} C_{U,2j}}{C_5} \right) \times V_{REFP} - \left( \frac{\sum_{j=1,j\ne i}^{2^n-1} C_{U,1j}}{C_1} - \frac{C_{U,2i}}{C_5} \right) \times V_{REFN} \tag{4}$$

The result of equation (3) minus equation (4) is equal to equation (2), i.e., the jump magnitude the transmission curve corresponding to the ith decision level.

In the present invention, in the normal mode, when the clock control signals $\Phi_1$, $\Phi_2$, $\Phi_4$ and $\Phi_5$ are at a low level, one end of the capacitor $C_4$ connected to the source of the NMOS switch $M_6$ is connected to the input terminal $V_{REFP}$, and in the test mode, when the clock control signals $\Phi_1$, $\Phi_2$, $\Phi_4$ and $\Phi_5$ are at a low level, one end of the capacitor $C_4$ connected to the source of the NMOS switch $M_7$ is connected to the input terminal $V_{REFN}$, for the purpose of ensuring that the swings of the outputs $V_{outp}$ and $V_{outn}$ of the switched-capacitor amplification unit in the test mode are the same as the swings of the outputs $V_{outp}$ and $V_{outn}$ of the switched-capacitor amplification unit in the normal operating mode.

In the invention, in the test mode, the in-phase analog input voltage signal $V_1$ is fixed at $-(V_{REFP}-V_{REFN})/2^n$ and the inverted analog input voltage signal $V_{inn}$ is fixed at $-(V_{REFP}-V_{REFN})/2^n+1$, for the purpose of ensuring that the analog input voltage in the test mode is lower than the reference voltages of all comparators in the comparator array.

The jump magnitude of the transmission curve of the sub-pipeline corresponding to each decision level can be measured so long as the inputs of the decoder traverse all logic input values (for a total of $2^n$ states) in the test mode. That is, the present invention can achieve magnitude measurement of the transmission curve within $2^n$ (n is the resolution of the sub-pipeline, and n≤4 for sub-A/D converters of stages of a current pipeline A/D converter) clock periods (Ts=1/fs, where fs is a working clock frequency of the pipeline), thereby providing a fast measurement speed; and a measurement result is sent to a back-end digital domain of the A/D converter for correction. Relatively speaking, the linearity of the A/D converter can be improved by 10-15 dB after the correction.

In summary, by changing the resolution of the sub-A/D converter, the number of comparators in the sub-A/D converter and ratios between capacitance values of capacitors in the switched-capacitor amplification unit, the present invention can implement a multi-bit sub-pipeline with a redundancy function, in which the A/D converter has a logic calibration function, which improves the flexibility of the converter design; by introducing the NOT gate G1, the tri-state output NOT gate G2 and the tri-state output NOT gate G3 as well as a control signal A3 in an output buffer of a corresponding comparator unit, it can be forcibly implemented with the control signal A3 that an input to each switched-capacitor DA unit in the sub-D/A converters in a holding stage is the positive reference voltage $V_{REFP}$ or the negative reference voltage $V_{REFN}$, and all these functions are implemented in the digital domain in a simple and flexible manner without increasing the design complexity in the analog domain; a comparator in the sub-A/D converter may be a comparator with a switched-capacitor structure or a dynamic comparator, and thus the present invention is applicable to a pipelined A/D converter without a sample-and-hold structure and a pipelined A/D converter with a sample-and-hold structure; and the present invention can achieve magnitude measurement of the transmission curve within $2^n$ (n is the resolution of the sub-pipeline, and n≤4 for sub-A/D converters of stages of a current pipeline A/D converter) clock periods (Ts=1/fs, where fs is a working clock frequency of the pipeline), thereby providing a fast measurement speed; and a measurement result is sent to a back-end digital domain of the A/D converter for correction, thereby improving the linearity of the A/D converter by 10-15 dB after the correction. Therefore, the present invention effectively overcomes various shortcomings of the prior art and has a high value for industrial use.

The above embodiments are merely illustrative of the principles of the present invention and effects thereof, and are not intended to limit the present invention. Any person skilled in the art can modify or change the above embodiments without departing from the spirit and scope of the present invention. Therefore, all equivalent modifications or changes made by those skilled in the art without departing from the spirit and technical ideas disclosed in the present invention still fall within the scope of the claims of the present invention.

What is claimed is:

1. A multi-bit resolution sub-pipeline structure for measuring a jump magnitude of a transmission curve, comprising:
  a sub-analog-to-digital converter having n-bit resolution configured to quantize input analog voltage signals under a clock signal and a digital control signal and output digital voltage signals, respectively, wherein the analog voltage signals comprise an in-phase analog voltage signal $V_{inp}$ and an inverted analog voltage signal $V_{inn}$; and a positive reference voltage $V_{REFP}$ and a negative reference voltage $V_{REFN}$;

a first sub-digital-to-analog converter and a second sub-digital-to-analog converter each having n-bit resolution, each configured to correspondingly convert the digital voltage signals output by the sub-analog-to-digital converter into respective analog voltage signals, respectively;

a decoder having n-bit resolution configured to decode an n-bit binary input signal and output the digital control signal; and a switched-capacitor amplification unit configured to, when in a normal mode, perform sampling and residue amplification on the input analog voltage signals; and when in a test mode, measure the jump magnitude of the transmission curve corresponding to each decision level.

2. The multi-bit resolution sub-pipeline structure for measuring a jump magnitude of a transmission curve according to claim 1, wherein the sub-analog-to-digital converter comprises:

at least two resistive voltage dividers configured to provide $2^n-1$ positive reference voltages and $2^n-1$ negative reference voltages, respectively, to a comparator array;

a comparator array connected to the at least two resistive voltage dividers, to compare the input in-phase analog voltage signal $V_{inp}$ and inverted analog voltage signal $V_{inn}$ with the positive $2^n-1$ reference voltages and negative $2^n-1$ reference voltages, respectively, and quantize the analog voltage signals and output $2^n-1$ digital voltage signals at each of four ports.

3. The multi-bit resolution sub-pipeline structure for measuring a jump magnitude of a transmission curve according to claim 2, wherein each resistive voltage divider comprises an input terminal $V_{RN}$, an input terminal $V_{RP}$, $2^n$ resistors and $2^n-1$ output terminals, where n is a natural number greater than zero; one end of a first resistor R1 is connected to the input terminal $V_{RN}$ connected to a negative reference voltage, and the other end of the first resistor R1 is connected to a first output terminal, and so on; and a $(2^{n-1})$th output terminal is connected between a $(2^n)$th resistor $R2^n$ and a $(2^{n-1})$th resistor $R2^{n-1}$, and the other end of the $(2^n)$th resistor $R2^n$ is connected to the input terminal $V_{RP}$ connected to a positive reference voltage.

4. The multi-bit resolution sub-pipeline structure for measuring a jump magnitude of a transmission curve according to claim 2, wherein the comparator array comprises:

comparators, each of which has a first input terminal $V_{in+}$ connected to the in-phase analog voltage $V_{inp}$, a second input terminal $V_{in-}$ connected to the inverted analog voltage $V_{inn}$, a third input terminal $V_{ref+}$ connected to the positive reference voltage $V_{REFP}$, and a fourth input terminal $V_{ref-}$ connected to the negative reference voltage $V_{REFN}$, to compare the magnitudes of the input analog voltages with those of the reference voltages, and correspondingly output, at a first output terminal OP and a second output terminal ON thereof, an in-phase digital voltage signal and an inverted digital voltage signal; and buffers, each of which has a first input terminal and a second input terminal correspondingly connected to the in-phase digital voltage signal and the inverted digital voltage signal output by the comparator subunit, a third input terminal connected to the digital control signal in the sub-analog-to-digital converter, and a fourth input terminal connected to the clock signal, with the buffers providing drive and test capabilities for switches in the sub-digital-to-analog converters, and outputting digital voltage signals at a first output terminal, a second output terminal, a third output terminal and a fourth output terminal thereof.

5. The multi-bit resolution sub-pipeline structure for measuring a jump magnitude of a transmission curve according to claim 4, wherein each buffer comprises a first NOT gate, a second NOT gate, a third NOT gate, a first tri-state NOT gate, a second tri-state NOT gate, a first NAND gate, a second NAND gate, a PMOS transistor $M_{16}$ and an NMOS transistor $M_{17}$; the third input terminal of the buffer is connected to an input terminal of the first NOT gate, an input terminal B of the first tri-state NOT gate, an input terminal B of the second tri-state NOT gate and a gate of the NMOS transistor $M_{17}$, and an output terminal of the first NOT gate is connected to an input terminal C of the first tri-state NOT gate, an input terminal C of the second tri-state NOT gate and a gate of PMOS transistor $M_{16}$; an input terminal A of the first tri-state NOT gate and an input terminal A of the second tri-state NOT gate are correspondingly connected to the second input terminal and the first input terminal of the buffer; an output terminal of the first tri-state NOT gate is connected to a drain of the PMOS transistor $M_{16}$ and an input terminal A of the first NAND gate, and an output terminal of the second tri-state NOT gate is connected to a drain of the NMOS transistor $M_{17}$ and an input terminal B of the second NAND gate; wherein a source of the PMOS transistor $M_{16}$ is connected to a digital power supply, and a source of the NMOS transistor $M_{17}$ is grounded; the fourth input terminal of the buffer is connected to the input terminal B of the first NAND gate and an input terminal A of the second NAND gate; the first NAND gate outputs a first digital voltage signal Y1, and the first digital voltage signal Y1 is processed by the second NOT gate to output a second digital voltage signal Y2; and the second NAND gate outputs a fourth digital voltage signal Y4, and the fourth digital voltage signal Y4 is processed by the third NOT gate to output a third digital voltage signal Y3.

6. The multi-bit resolution sub-pipeline structure for measuring a jump magnitude of a transmission curve according to claim 5, wherein each tri-state NOT gate comprises PMOS transistors $M_{18}$ and $M_{19}$, and NMOS transistors $M_{20}$ and $M_{21}$; the input terminal A of the tri-state NOT gate is connected to gates of the PMOS transistor $M_{18}$ and the NMOS transistor $M_{21}$, and the input terminal B of the tri-state NOT gate is connected to a gate of the PMOS transistor $M_{19}$, and the input terminal C of the tri-state NOT gate is connected to a gate of the NMOS transistor $M_{20}$; a source of the PMOS transistor $M_{18}$ is connected to the digital power supply and a drain thereof is connected to a source of the PMOS transistor $M_{19}$, and drains of the PMOS transistor $M_{19}$ and the NMOS transistor $M_{20}$ are interconnected and serve as the output terminal of the tri-state NOT gate; and a source of the NMOS transistor $M_{20}$ is connected to a drain of the NMOS transistor $M_{21}$, and a source of the NMOS transistor $M_{21}$ is grounded.

7. The multi-bit resolution sub-pipeline structure for measuring a jump magnitude of a transmission curve according to claim 1, wherein the first sub-digital-to-analog converter and the second sub-digital-to-analog converter are each configured to perform digital-to-analog conversion on the input digital voltage signals, have input terminals $G_1$, $G_2$ and $G_3$ as digital voltage signal input terminals, an input terminal $V_1$ as an analog voltage signal input terminal, and input terminals $V_2$ and $V_3$ as reference voltage signal input terminals, wherein each sub-digital-to-analog converter includes $2^n-1$ switched-capacitor DAC units, and each switched-capacitor DAC unit includes input terminals $G_1$, $G_2$, $G_3$, $V_1$, $V_2$, and $V_3$; and in each sub-digital-to-analog converter, the input terminal $G_1$ of an ith switched-capacitor DAC unit DA(i) is connected to an input terminal $\Phi$, the input terminal $V_1$ of the ith switched-capacitor DAC unit DA(i) is connected to an input terminal $V_{in}$, the input terminal $G_2$ of the ith switched-capacitor DAC unit DA(i) is connected to an input terminal CK1<i>, the input terminal $V_2$ of the ith switched-capacitor DAC unit DA(i) is connected to an input terminal $V_{RN}$, the input terminal $G_3$ of the ith switched-capacitor DAC unit DA(i) is connected to an input terminal CK2<i>, the input terminal $V_3$ of the ith switched-capacitor DAC unit DA(i) is connected to an input terminal $V_{RP}$, and an output terminal D of the ith switched-capacitor DAC unit DA(i) is connected to an output terminal $V_C$, where i=1, . . . , $2^n-1$.

8. The multi-bit resolution sub-pipeline structure for measuring a jump magnitude of a transmission curve according to claim 7, wherein each switched-capacitor DAC unit comprises NMOS switching transistors $M_{22}$ and $M_{23}$, a PMOS switching transistor $M_{24}$ and a capacitor $C_U$; the digital voltage signal input terminals $G_1$, $G_2$ and $G_3$ of the switched-capacitor DAC unit are correspondingly connected to gates of the NMOS switching transistors $M_{22}$ and $M_{23}$ and the PMOS switching transistor $M_{24}$; the analog voltage signal input terminals $V_1$ and $V_2$ of the switched-capacitor DAC unit are correspondingly connected to drains of the NMOS switching transistors $M_{22}$ and $M_{23}$, and the analog voltage signal input terminal $V_3$ of the switched-capacitor DAC unit is connected to a source of PMOS switching transistor $M_{24}$; and sources of the NMOS switching transistors $M_{22}$ and $M_{23}$ and the drain of the PMOS switching transistor $M_{23}$ are jointly connected to the capacitor $C_U$, and the other end of the capacitor $C_U$ is the output terminal of switched-capacitor DAC unit.

9. The multi-bit resolution sub-pipeline structure for measuring a jump magnitude of a transmission curve according to claim 1, wherein the switched-capacitor amplification unit comprises sampling capacitors $C_1$, $C_2$, $C_3$, $C_4$ and $C_5$, NMOS switches $M_1$, $M_2$, $M_3$, $M_4$, $M_5$, $M_6$, $M_7$, $M_8$, $M_9$, $M_{10}$, $M_{11}$, $M_{12}$, $M_{13}$, $M_{14}$ and $M_{15}$, and a fully differential operational amplifier OTA, wherein one end of the capacitor $C_1$ is connected to an in-phase input terminal $V_{i+}$ of the fully differential operational amplifier OTA, and the other end of the capacitor $C_1$ is connected to a source of the NMOS switch $M_1$ and a drain of $M_{10}$; one end of the capacitor $C_2$ is connected to the in-phase input terminal $V_{i+}$ of the fully differential operational amplifier OTA, and the other end of the capacitor $C_2$ is connected to a source of the NMOS switch $M_2$ and a source of $M_3$; one end of the capacitor $C_3$ is connected to an inverted input terminal $V_{i-}$ of the operational amplifier, and the other end of the capacitor $C_3$ is connected to a source of the NMOS switch $M_4$ and a source of $M_5$; one end of the capacitor $C_4$ is connected to the inverted input terminal $V_{i-}$ of the operational amplifier, and the other end of the capacitor $C_4$ is connected to a source of the MOS switch $M_6$, a source of $M_7$ and a source of $M_8$; one end of the capacitor $C_5$ is connected to the inverted input terminal of the fully differential operational amplifier OTA, and the other end of the capacitor $C_5$ is connected to a source of the MOS switch $M_9$ and a drain of $M_{14}$; the in-phase analog voltage signal $V_{inp}$ is connected to drains of the NMOS switches $M_1$ and $M_2$; drains of the NMOS switches $M_3$ and $M_4$ are connected to the positive reference voltage $V_{REFP}$; the inverted analog voltage signal $V_{inn}$ is connected to drains of the NMOS switches $M_5$, $M_8$ and $M_9$; the positive reference voltage $V_{REFP}$ is connected to a drain of the NMOS switch $M_6$; the negative reference voltage $V_{REFN}$ is connected to a drain of the NMOS switch $M_7$; a drain of NMOS switch $M_{11}$ and a source of $M_{13}$ are connected to the in-phase input terminal $V_{1+}$ of the fully differential operational amplifier OTA; a drain of the NMOS switch $M_{12}$ and a drain of $M_{13}$ are connected to the inverted input terminal $V_{i+}$ of the operational amplifier OTA; sources of the NMOS switches $M_{11}$ and $M_{12}$ are connected to an input terminal $V_B$; a source of the NMOS switch $M_{10}$ and a source of $M_{15}$ are connected to an output $V_{outp}$; a source of the NMOS switch $M_{14}$ and a drain of $M_{15}$ are connected to an output $V_{outn}$; an input terminal $\Phi_1$ is connected to gates of the NMOS switches $M_1$ and $M_2$; an input terminal $\Phi_7$ is connected to gates of the NMOS switches $M_3$ and $M_4$; an input terminal $\Phi_5$ is connected to gates of the NMOS switches $M_5$, $M_8$ and $M_9$; an input terminal $\Phi_8$ is connected to a gate of the NMOS switch $M_6$; an input terminal $\Phi_9$ is connected to a gate of the NMOS switch $M_7$; an input terminal $\Phi_3$ is connected to a gate of the NMOS switch $M_{10}$; an input terminal $\Phi_4$ is connected to a gate of the NMOS switch $M_{15}$; an input terminal $\Phi_6$ is connected to a gate of the NMOS switch $M_{14}$; and an input terminal $\Phi_2$ is connected to gates of the NMOS switches $M_{11}$, $M_{12}$ and $M_{13}$.

10. The multi-bit resolution sub-pipeline structure for measuring a jump magnitude of a transmission curve according to claim 9, wherein the capacitance value of the capacitor $C_2$ is equal to the sum of the capacitance values of the capacitor $C_3$ and the capacitor $C_4$.

\* \* \* \* \*